United States Patent [19]

Rottner et al.

[11] Patent Number: 5,705,406
[45] Date of Patent: *Jan. 6, 1998

[54] METHOD FOR PRODUCING A SEMICONDUCTOR DEVICE HAVING SEMICONDUCTOR LAYERS OF SIC BY THE USE OF AN ION-IMPLANTATION TECHNIQUE

[75] Inventors: Kurt Rottner; Adolf Schöner; Nils Nordell, all of Kista, Sweden

[73] Assignee: ABB Research Ltd., Zurich, Switzerland

[*] Notice: The term of this patent shall not extend beyond the expiration date of Pat. No. 5,674,765.

[21] Appl. No.: 636,969

[22] Filed: Apr. 24, 1996

[51] Int. Cl.⁶ ............................. H01L 21/22; H01L 21/74
[52] U.S. Cl. ............................. 437/22; 437/26; 437/100
[58] Field of Search .................... 437/20, 26, 27, 437/22, 100, 21; 148/DIG. 76, DIG. 148; 257/22

[56] References Cited

U.S. PATENT DOCUMENTS

| | | | |
|---|---|---|---|
| 4,775,882 | 10/1988 | Miller et al. | 357/35 |
| 5,030,580 | 7/1991 | Furukawa et al. | 437/22 |
| 5,135,885 | 8/1992 | Furukawa et al. | 437/22 |
| 5,270,554 | 12/1993 | Palmour | 257/77 |
| 5,322,802 | 6/1994 | Baliga et al. | 437/26 |
| 5,378,642 | 1/1995 | Brown et al. | 437/40 |
| 5,510,281 | 4/1996 | Ghezzo et al. | 437/40 |

FOREIGN PATENT DOCUMENTS 1-109 738A  4/1989  Japan .......................... 437/26

OTHER PUBLICATIONS

Sonntag et al., Ion–Implantation Doping of Crystalline 6H–SiC, Applied PhysicsA 61, pp. 363–367, Springer–Verlag 1995.

Vodakov et al., Diffusion and Solubility of Impurities in Silicon Carbide, Intern. Conf. on Silicon Carbide, University of South Carolina, 1973.

Rao et al., P–N Junction Formation in 6H–SiC by Acceptor Implantation into N–type Substrate, Nuclear Instruments and Methods in Physics Research B 106, 1995, pp. 333–338.

Rao et al., Al and B Ion–Implantations in 6H– and 3C–SiC, J. Appl. Phys. 77 (6) Mar. 1995, pp. 2479–2485.

Ahmed et al., Boron and Aluminim Implantation in α–SiC, Appl. phys. Lett. 65 (1), Jul. 1994, pp. 67–69.

Ghezzo et al, Nitrogen–Implanted SiC Diodes Using High–Temperature Implantation, IEEE Electron Device Letters, vol. 13, No. 12, Dec. 1992, pp. 639–641.

Shenoy et al., Planar, Ion Implanted, High Voltage 6H–SiC P–N Junction Diodes, IEEE Electron Device Letters, vol. 16, No. 10, Oct. 1995, pp. 454–456.

Kalinina et al., Electrical Properties of P–N Junctions Formed By Ion Implantation In N–Type SiC, Sov. Phys. Semicond. 12 (12), Dec. 1978, pp. 1372–1374.

(List continued on next page.)

Primary Examiner—John Niebling
Assistant Examiner—S. Mulpuri
Attorney, Agent, or Firm—Pollock, Vande Sande & Priddy

[57] ABSTRACT

A method for producing a semiconductor device having semiconductor layers of SiC with at least three doped layers on top of each other, comprises the steps of growing a first semiconductor layer of SiC; implanting an impurity dopant into the first layer to form a second doped surface layer as a sub-layer therein, the second doped surface layer being surrounded, except for the top surface thereof, by the first semiconductor layer; and epitaxially growing a third semiconductor layer of SiC on top of the second layer of SiC and regions of the first layer adjacent thereto to totally bury the second semiconductor layer. The impurity dopant implanted into the first semiconductor layer is of a first conductivity n or p type, and the first semiconductor layer being doped with a second, opposite conductivity type, so as to form a pn-junction at the interface between the first and second layers.

15 Claims, 1 Drawing Sheet

OTHER PUBLICATIONS

Ghezzo et al., Boron–Implanted 6H–SiC Diodes, Appl. Phys. Lett. 63 (9), Aug. 1993, pp. 1206–1208.

Planson et al., Evaluation of 6H–SiC Mesa $N^+P$ Junction Breakdown Voltage, Proceedings of the First International Power Electronics and Motion Control Conference, IPEMC'94, Bejing, 1994 International Academic Publishers, pp. 142–145.

Addamiano et al., Ion Implantation Effects of Nitrogen, Boron, and Aluminum in Hexagonal Silicon Carbide, Journal of the Electrochemical Society, Solid–State Science and Technology, 1972, pp. 1355–1361.

Rao et al., Al, Al/C and Al/Si Implantations in 6H–SiC, Journal of Electronic Materials, vol. 25, No. 1, 1996, pp. 75–80.

METHOD FOR PRODUCING A SEMICONDUCTOR DEVICE HAVING SEMICONDUCTOR LAYERS OF SIC BY THE USE OF AN ION-IMPLANTATION TECHNIQUE

TECHNICAL FIELD OF THE INVENTION

The present invention relates to a method for producing a semiconductor device having semiconductor layers of SiC with at least three doped layers on top of each other, comprising a step a) of growing a first semiconductor layer of SiC, a step b) following step a) of implanting an impurity dopant into the first layer for forming a second doped surface layer as a sub-layer therein, as well as a semiconductor device produced by carrying out such a method.

BACKGROUND OF THE INVENTION

Such an ion implantation technique may be used for production of all types of semiconductor devices such as, for example, different types of diodes, transistors and thyristors, and it is an attractive technique in device fabrication as it allows control of both impurity level and distribution. This technique is well developed for Si-devices, but the method successfully used for ion implantation for such devices may not be utilized for SiC-devices due to the completely different character of SiC as compared to Si. Such devices of SiC are particularly used in applications in which it is possible to benefit from the superior properties of SiC in comparison with primarily Si, namely the capability of SiC to function well under extreme conditions. SiC has a high thermal stability due to a large bandgap energy, so that devices fabricated from that material are able to operate at high temperatures, namely up to 1000° K. Furthermore, it has a high thermal conductivity and more than five times higher breakdown field than Si, so that SiC-devices may be arranged at a high density. Therefore SiC is well suited as a material in high power devices operating under conditions where high voltages may occur in the blocking state of the device.

Accordingly, it is highly desired to find means to control this technique of device fabrication also for SiC to allow the production of an extended amount of SiC-semiconductor devices of a high quality especially for power applications.

Known methods of the type defined in the introduction, i.e. which use an implantation step, have several limitations. One principle limitation of ion implantation is that the doping concentration can only be enlarged, which means that the density of impurity centers can only be increased by implantation. However, in some device applications, structures with low doped layers on top of higher doped layers are desirable, but it has not been successful so far to utilize the implantation technique in SiC and to realize the advantages thereof connected to the possible formation of planar structures instead of mesa-structures for obtaining such desired structures with a high quality. Firstly the depth into which it may be implanted in SiC is strongly limited. The maximum implantation depth is given by the acceleration energy of the ions shot onto the SiC-surface. Furthermore, the minimum thickness of such a layer increases with the acceleration energy, due to range straggling, which means that the limit of a layer created by implantation while using high acceleration energy will be very broad, and the minimum thickness of the layer might be too large for some device applications. Additionally, the damage profile of a high energy implantation extends up to the surface of the SiC-layer into which it has been implanted. Thus, in the low-doped surface layer the implantation damage can act as a lifetime killer for charge carriers and decrease the carrier mobility severely by formation of compensation. Accordingly, it has not been possible to form a layer having a thick layer on top thereof in SiC by using the implantation technique for forming the lower layer, and the formation of a layer by implantation in SiC at a distance from the surface thereof has resulted in very poor quality of the layer on top of the implanted layer.

SUMMERY OF THE INVENTION

The object of the present invention is to provide a method of the type discussed in the introduction making it possible to solve the problems mentioned above to a large extent.

This object is, in accordance with the invention, obtained by providing such a method with a step c) following upon step b) (referred to above) and in which a third semiconductor layer of SiC is epitaxially grown on top of the second layer of SiC. The combination of ion implantation and epitaxial growth thereafter, which, in fact, is a so-called regrowth, since the first layer is first grown and a further process step is then carried out before the epitaxial growth of the third layer takes place, is very advantageous. This due to the fact that it is less complicated to carry out such a regrowth on an implanted structure than on etched mesa-structures having different crystal orientation around the mesa. Furthermore, the surface used for the regrowth can be chosen in a way to give optimum results of the regrowth, for instance by determining the surface orientation of the second layer resulting from the epitaxial growth of the first layer, since the ion implantation does not change this condition. It would also be possible to obtain this orientation by, for instance, hydrogen-etching. Another advantage of such a method is that it will be possible to position a certain layer obtained by implantation deep into a semiconductor structure without damaging the layer on top thereof since the implantation damage is restricted to the implanted volume and does not affect other device parts. Thus, it will be possible to form a low-doped layer on top of the implanted layer without damage therein being harmful to the carrier life time and mobility in the low doped layer. Of course the layer on top of the implanted layer does not have to be low doped, but it may be given any desived doping concentration. Accordingly, the depth of buried structures is no longer limited by the implantation energy, so that it is possible to use a lower energy for the implantation and there by obtain a more clear border between the layer implanted and the other layers. Thus, the combination of implantation and regrowth allows the fabrication of designed buried structures in SiC while obtaining a high quality of all the layers of the semiconductor device so created.

According to a preferred embodiment of the invention, the growth in the step c) is carried out at such a high temperature that the dopants implanted in step b) are made electrically active and implantation damage is reduced. Accordingly, the epitaxial growth of the third layer will, in this way, replace the annealing step normally required for activating the implanted dopant. It would, however, still be possible to include an additional annealing step in the regrowth procedure.

According to another preferred embodiment of the invention, the third semiconductor layer is, according to step c), grown by Chemical Vapor Deposition which is the most frequently used technique for epitaxially growing layers of SiC and makes it possible to obtain a high quality of such grown layers. Such CVD-growth is normally carried out at such high temperatures that the implanted second layer will automatically be annealed during this growth.

According to another preferred embodiment of the invention the implantation in step b) is carried out for producing a second doped surface layer which is surrounded, except for the top surface thereof, by the first semiconductor layer, and the third semiconductor layer is in step c), epitaxially grown on top of the second layer as well as regions of the first layer next thereto, and surrounding it so as to totally bury the second semiconductor layer. This constitutes an advantageous way to form a buried structure, i.e. a structure in which a layer is totally surrounded by other layers, and accordingly the junctions to this layer are in the bulk of a semiconductor device with this structure.

According to another preferred embodiment of the invention, an impurity dopant of a first conductive type, either n or p, is according to step b) implanted in the first semiconductor layer, being doped according to a second opposite conductivity type for forming a pn-junction at the interface between the first and second layers. This makes it possible to use the implantation technique for forming pn-junctions in a semiconductor device also when this has been located under another semiconductor layer and, accordingly, the second layer is buried in the semiconductor structure.

According to another preferred embodiment of the invention, boron is implanted as impurity dopant in step b) and the implantation is carried out while keeping the first semiconductor layer of SiC at a temperature of 400°–600° C. Experiments have shown that the regrowth of SiC on the layer so obtained leads to good results.

According to another preferred embodiment of the invention, the third semiconductor layer is, in step c), grown with a lower doping concentration than the doping concentration of the second semiconductor layer obtained by the implantation. In this way it is possible to form a low-doped layer of high quality on top of a layer obtained by ion implantation, and according to another preferred embodiment of the invention, the third semiconductor layer is in step c) grown while giving it a low doping concentration. This means that the doping concentration will be below $10^{17} cm^{-3}$, and the doping may be obtained without any supply of dopants during the growth but only through the inevitable impurity incorporation of nitrogen during the growth process. Although this constitutes preferred embodiments of the invention, other doping concentrations are of course conceivable.

According to another preferred embodiment of the invention, said method comprises several alternating successive steps of implantation and regrowth according to steps b) and c). Such a method enables the fabrication of semiconductor structures having an arbitrary number of implanted buried layers at any desired depth therein.

According to a further preferred embodiment of the invention, the regrowth of layers is coordinated with the conditions of the implantation step following thereupon for making the layer obtained by that implantation step extending through the entire layer previously regrown and connecting to the layer previously obtained by the previous implantation step for forming a continuous thick implanted layer. Accordingly, such a series of successive regrowth and implantation steps may be used for forming also thick layers of a high quality by using the implantation technique, so that much thicker layers may be obtained by implantation than before.

According to another preferred embodiment of the invention, a regrowth step is carried out after the last implantation step for forming the thick, continuous implanted layer for forming a semiconductor device having a thick buried layer. This method enables the formation of a thick buried semiconductor layer in SiC by using the implantation technique.

A semiconductor device according to the independent appended device claim is also provided in accordance with the invention. The advantages thereof are the same as discussed for the corresponding method claims.

Further preferred features and advantages of the invention will appear from the following description and the other dependent claims.

BRIEF DESCRIPTION OF THE DRAWING

With reference to the appended drawing below, follows a specific description of preferred embodiments of the invention cited as examples.

In the drawings.

DETAILED DESCRIPTION OF PREFERRED EMBODIMENTS

Figure 1:
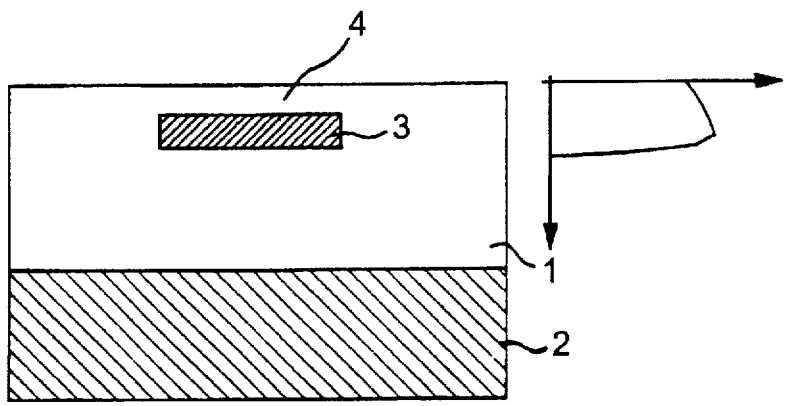
FIG. 1 illustrates symmetrically the semiconductor structure produced by a method according to the prior art and a graph of the implantation damage thereof as a function of the depth of the semiconductor layer.

FIG. 1 illustrates clearly the disadvantages of prior art methods for producing at least three successive semiconductor layers of SiC on top of each other by using the implantation technique for creating the intermediate layer. In this method, a first low doped n-type layer 1 of SiC is epitaxially grown on top of a highly doped n-type substrate layer 2, as a result of which good ohmic contact may be established to a device. After that, impurity dopants of p-type have been implanted into the first layer 1 by using a high acceleration energy, so that a second doped layer 3 of p-type is created in that first layer 1. After that, the layers have to be heated at a high temperature for annealing the second layer 3. In the vertical direction across the second layer 3 the following order of layers, is in this way, created: A first layer 1 under the second layer 3 and on top thereof a third layer 4 constituted by the low doped n-type region of the first layer 1 located over the second layer. The graph to the right illustrating the implantation damage as a function of the depth shows that this third layer 4 is severely damaged. The damage acts as a lifetime killer and decreases the carrier mobility dramatically by formation of compensation.

Figure 2:
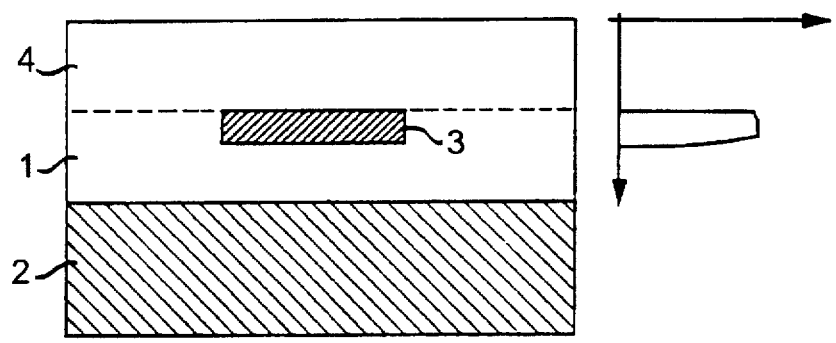
FIG. 2 is a view, corresponding to FIG. 1, of a semiconductor structure produced by a method according to a preferred embodiment of the invention and a graph of the implantation damage thereof as a function of the depth of the semiconductor layer.

FIG. 2 illustrates a semiconductor structure produced by a method according to a preferred embodiment of the invention. In this method, step a) of epitaxial growth of a first semiconductor layer 1 of SiC on top of the substrate layer 2 has first been carried out. After that, ions of p-type have been implanted by using a comparatively low energy to form a second surface layer 3 in the first layer 1. The second layer 3 may be given rather distinct borders thanks to the possibility to implant ions with a comparatively low energy. After that, a third step c) is carried out, in which a third layer 4 of SiC is epitaxially grown on top of the first 1 and second 3 layer while using the Chemical Vapour Deposition technique. As a result the layers, are during this growth, heated at a high temperature, preferably above 1500° C., which will turn the impurity dopants implanted in step b) electrically active and will also reduce implantation damage. Implantation in step b) is preferably carried out while keeping the first semiconductor layer (1) of SiC at a temperature of 400°–600° C. This regrowth may result in a very high quality of the third layer, since the ion implantation has not changed the orientation of the layer thereunder, and the surface on which it is grown has the desired quality. It is clearly illustrated that a buried layer 3, which preferably has another doping than the first 1 and third 4 layers may be buried to this way in an arbitrary depth without using any high implantation energies. Furthermore the graph to the right in FIG. 2, shows that the implantation damage is restricted to the implanted volume and does not affect other device parts.

Figures 3A, 3B, 3C, 3D, 3E, 3F:
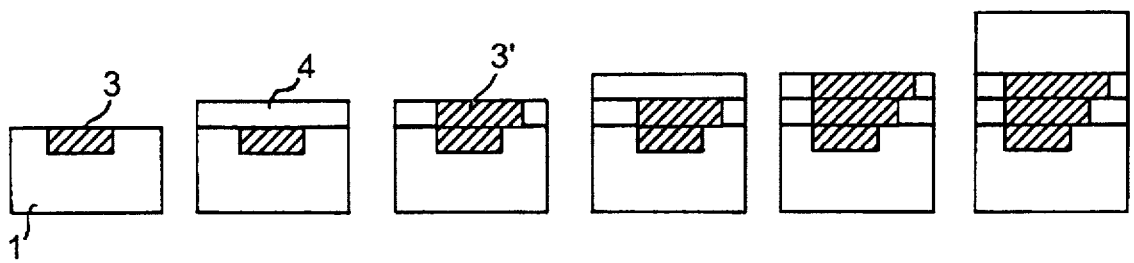
FIG. 3A–F are very schematic views illustrating how a thick, buried semiconductor layer produced by implantation may be created by alternating successive implantation and regrowth steps in a method according to a preferred embodiment of the invention.

It is illustrated in FIG. 3 how it will be possible to form thicker buried structures by successive regrowth and implantation steps. FIG. 3A illustrates how an implanted layer 3 is created in a first layer 1. FIG. 3B shows that a third layer 4 has been epitaxially grown on top of the first 1 and second 3 layers to a thickness substantially corresponding to the second layer while annealing that layer. FIG. 3C illustrates how a further implantation step is carried out to form another implanted layer 3', whereupon according to FIG. 3D, a further regrowth step is carried out. This sequence may be repeated as long as desired, and in this case three such implanted layers are created before a final layer is epitaxially grown thereupon with the end result shown in FIG. 3F. In this way, it is possible to obtain a thick buried second layer by adding the three implanted layers to each other as a result of the coordination of the regrowth of layers with the conditions of the implantation step following thereupon, thereby making the layer obtained by the implantation step extend through the entire layer previously regrown. In FIG. 3A–F it has, on the left hand side, been illustrated how the method may be carried out to obtaining a vertical shape of the thick layer. Another advantage of this method is that bevelled forms may be created as illustrated on the right-hand part of each figure.

The different lateral extensions of the implanted layers in FIG. 2 as well as in FIG. 3A–F have been achieved by using conventional semiconductor processing techniques, such as masking.

Figure 4:
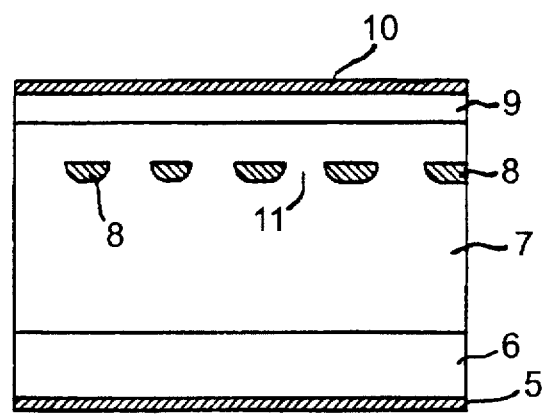
FIG. 4 is a schematic view illustrating a device structure in the form of a high voltage J-FET obtainable by utilising the method according to the present invention.

FIG. 4 shows a high voltage J-FET as an example of a device structure using buried grids and obtainable by the inventive method. This semiconductor device has (a) a lower drain 5, a (b) highly doped n-type substrate layer 6 for forming a good contact to the drain, (c) a low-doped n-type drift region layer 7, (d) in which highly doped p-type gate layers 8 are buried and (d) an additional highly doped n-type layer for forming a contact layer to a source 10. The width of conducting channels 11 between adjacent gate layers 8 may be varied by varying voltage applied on the gates, so that a current through the device may be controlled in that way and totally cut off by turning the channel regions into p-type layers. The buried layers 8 have been formed by an implantation step, and thereafter the rest of the layer 7 has been grown on top thereof, and then the introduction of dopants has been raised to obtain the highly doped layer 9 on top thereof. Thus, a pn-junction could, in this way, be formed deeply in a semiconductor device in desired positions while obtaining an optimum crystalline quality of the layers on top thereof.

The invention is, of course, not in any way restricted to the preferred embodiments described above, but many possibilities and modifications thereof will be apparent to one of ordinary skill in the art without departing from the basic idea of the invention.

The conductivity types of the dopants mentioned above may, of course, be exchanged, so that, for instance n-type dopants are implanted in a p-type first layer. Furthermore, under certain circumstances, it may be desired to implant dopants of the same conductivity type as of the layer into which it is implanted; and this alternative is also intended to lie within the scope of the invention.

Furthermore, it is not necessary that a semiconductor device produced by using the method according to the invention has SiC as the only semiconductor material; only the first, second, and third layers have to be of SiC and the device may have a hetero-character should this be desired.

The definition "layers" is to be interpreted broadly and comprises all types of volume extensions and shapes.

All definitions concerning the material of the different layers of course also include inevitable impurities as well as intentional doping when SiC is concerned. "A semiconductor layer of SiC" is to be interpreted as covering the case in which small amounts of other elements are added to that layer, e.g. smaller amounts of group 3B-elements.

A number of further conventional process steps, such as passivation, well known to those skilled in the art may be combined with the steps according to the inventive method here disclosed for production of semiconductor devices therethrough.

It has been illustrated above how the first semiconductor layer is also epitaxially grown in step a), but it is within the scope of the invention to use a substrate for this first layer, so that the growth in step a) is then accomplished by using the sublimation technique.

We claim:

1. A method for producing a semiconductor device having semiconductor layers of SiC with at least three doped layers on top of each other, comprising the steps of:

a) growing a first semiconductor layer of SiC;

b) implanting an impurity dopant into said first layer to form a second doped surface layer as a sub-layer therein, said second doped surface layer being surrounded, except for the top surface thereof, by said first semiconductor layer; and c) epitaxially growing a third semiconductor layer of SiC on top of said second layer of SiC and regions of said first layer adjacent thereto to totally bury said second semiconductor layer; and wherein said impurity dopant implanted into said first semiconductor layer is of a first conductivity n or p type, said first semiconductor layer being doped with a second, opposite conductivity type, so as to form a pn-junction at the interface between said first and second layers.

2. A method according to claim 1 wherein said growing in step c) is carried out at such a temperature that the dopants implanted in step b) are made electrically active and implantation damage is reduced.

3. A method according to claim 1 wherein said temperature is higher than 1,500° C.

4. A method according to claim 1 wherein in step c) said third semiconductor layer is grown by Chemical Vapor Deposition (CVD).

5. A method according to claim 1 wherein said impurity dopant implanted in step b) is of p-type.

6. A method according to claim 5, wherein boron is said impurity dopant in step b).

7. A method according to claim 5, wherein aluminum is said impurity dopant in step b).

8. A method according to claim 6 wherein the implantation step b) is carried out while keeping the first semiconductor layer of SiC at a temperature of 400°–600° C.

9. A method according to claim 1 wherein adjacent layers of said three layers are doped with dopants of different n or p conductivity types.

10. A method according to claim 9 wherein in step c) said third semiconductor layer is grown with a lower doping concentration than the doping concentration of the second semiconductor layer obtained by said implantation.

11. A method according to claim 1 wherein said first and third layers are epitaxially grown in step a) and step c) while doping said layers with n-type dopants.

12. A method according to claim 11 wherein said third semiconductor layer is grown in step c) at a lower doping concentration than the dopant concentration of the second semiconductor layer.

13. A method according to claim 1 further comprising several alternating successive steps of implantation and regrowth according to steps b) and c).

14. A method according to claim 13 wherein the regrowth of layer is coordinated with the conditions of the implantation step following thereupon to make the layer obtained by that implantation step extending through the entire layer previously regrown and connecting to the layer previously obtained by the previous implantation step for forming a continuous thick implanted layer.

15. A method according to claim 1 wherein a regrowth step is carried out after the last implantation step to form said thick continuous implanted layer thereby forming a semiconductor device having a thick buried layer.

* * * * *

UNITED STATES PATENT AND TRADEMARK OFFICE
CERTIFICATE OF CORRECTION

PATENT NO. :   5,705,406
DATED      :   January 6, 1998
INVENTOR(S):   Rottner et al.

It is certified that error appears in the above-identified patent and that said Letters Patent is hereby corrected as shown below:

Claim 1, line 4, after "SiC" add --on a substrate--.

Signed and Sealed this

Seventh Day of April, 1998

Attest:

BRUCE LEHMAN

Attesting Officer

Commissioner of Patents and Trademarks